United States Patent
Pappas et al.

(10) Patent No.: US 7,450,353 B2
(45) Date of Patent: Nov. 11, 2008

(54) ZIG-ZAG SHAPE BIASED ANISOTROPIC MAGNETORESISTIVE SENSOR

(75) Inventors: David P. Pappas, Louisville, CO (US); Fabio da Silva, Boulder, CO (US); Jose Aumentado, Louisville, CO (US)

(73) Assignee: The United States of America as represented by the Secretary of Commerce, The National Institute of Standards & Technology, Washington, DC (US)

( * ) Notice: Subject to any disclaimer, the term of this patent is extended or adjusted under 35 U.S.C. 154(b) by 456 days.

(21) Appl. No.: 11/246,322

(22) Filed: Oct. 6, 2005

(65) Prior Publication Data

US 2006/0215332 A1 Sep. 28, 2006

Related U.S. Application Data

(60) Provisional application No. 60/621,863, filed on Oct. 25, 2004.

(51) Int. Cl.
*G11B 5/33* (2006.01)
(52) U.S. Cl. ..................................... 360/327
(58) Field of Classification Search .................. None
See application file for complete search history.

(56) References Cited

U.S. PATENT DOCUMENTS

| | | | |
|---|---|---|---|
| 2,026,798 A | 1/1936 | Pogue | 261/13 |
| 2,218,922 A | 10/1940 | Newbery | 48/107 |
| 2,982,528 A | 5/1961 | Shelton | 261/130 |
| 3,294,381 A | 12/1966 | Schwartz | 261/145 |
| 6,633,462 B2 * | 10/2003 | Adelerhof | 360/315 |
| 6,693,774 B2 | 2/2004 | Watanabe et al. | 360/319 |
| 6,707,293 B2 | 3/2004 | Wan et al. | 324/207.25 |
| 6,713,800 B2 | 3/2004 | Chen et al. | 257/295 |
| 6,762,915 B2 | 7/2004 | Pokhil et al. | 360/324.11 |
| 6,791,804 B2 * | 9/2004 | Aoki et al. | 360/322 |
| 2003/0095362 A1 * | 5/2003 | Aoki et al. | 360/322 |
| 2004/0109265 A1 | 6/2004 | Gill | 360/324.12 |
| 2004/0114282 A1 | 6/2004 | Lee et al. | 360/322 |
| 2004/0141262 A1 | 7/2004 | Takahashi et al. | 360/327.3 |
| 2004/0145836 A1 | 7/2004 | Kojima et al. | 360/324.12 |
| 2004/0179312 A1 | 9/2004 | Freitag et al. | 360/324.12 |
| 2004/0184196 A1 | 9/2004 | Jayasekara | 360/319 |
| 2004/0196595 A1 | 10/2004 | Gambino et al. | 360/324 |
| 2004/0201377 A1 | 10/2004 | Buchhold | 324/207.21 |

OTHER PUBLICATIONS

*General Magnetoresistive Sensors for Magnetic Field Measurement*, Philips Semiconductors, Sep. 6, 2000 C.H. Smith, R.W. Schneider, *Chip-Size Magnetic Sensor Arrays*, Sensors EXPO, May 21, 2002 M.R.J. Gibbs, E.W. Hill, P.J. Wright, *Magnetic Materials for MEMS Applications*, Journal of Physics D: Applied Physics, Oct. 28, 2004.

* cited by examiner

*Primary Examiner*—Mark Blouin
(74) *Attorney, Agent, or Firm*—Kermit D. Lopez; Luis M. Ortiz; Ortiz & Lopez, PLLC

(57) ABSTRACT

A magnetoresistive sensing apparatus is disclosed, comprising a magnetic film having a zig-zag shaped structure, a central axis, and a magnetization associated with the magnetic film, wherein the zig-zag shaped structure biases the magnetization direction alternately at positive and negative angles thereof, thereby permitting the magnetoresistive sensing apparatus to be sensitive to a magnetic field parallel to the axis of the magnetoresistive sensing apparatus and insensitive to magnetic fields perpendicular to the axis.

20 Claims, 2 Drawing Sheets

ZIG-ZAG SHAPE BIASED ANISOTROPIC MAGNETORESISTIVE SENSOR

REFERENCE TO RELATED APPLICATION

This patent application claims priority under 35 U.S.C. § 119(e) to provisional patent application Ser. No. 60/621,863 entitled "Zig-Zag Shaped Biased Anisotropic Magnetoresistive Sensor," which was filed on Oct. 25, 2004, the disclosure of which is incorporated herein by reference.

TECHNICAL FIELD

Embodiments are generally related to sensing devices and methodologies. Embodiments are also related to magnetic sensors. Embodiments are additionally related to magnetoresistive sensors and components thereof.

BACKGROUND OF THE INVENTION

Magnetoresistive components are utilized in a variety of magnetic sensing applications. Among the applications that magnetic sensing devices find usefulness in are operations, such as, for example, navigation, position sensing, current sensing, vehicle detection, and rotational displacement. Many types of magnetic sensors are in use, but essentially all provide at least one output signal that represents the magnetic field sensed by the device. The Earth, magnets, and electrical currents can all generate magnetic fields. The sensor may be able to detect the presence, the strength, and/or the direction of the magnetic field. The strength of the magnetic field may be represented by a magnitude and a polarity (positive or negative). The direction of the magnetic field may be described by its angular position with respect to the sensor. One of the benefits of using magnetic sensors is that the output of the sensor is generated without the use of contacts. This is a benefit because over time contacts can degrade and cause system failures.

One type of magnetoresistive component that is often used in magnetic sensors is the anisotropic magnetoresistive (AMR) element. In high aspect (i.e., length to width) AMR sensor devices, for example, magnetic biasing is typically accomplished utilizing either equipotential straps located on top of the AMR sensing device that are oriented at angle, thereby biasing the current, or by utilizing an adjacent magnetic film or current to create a magnetic field that exerts a force on the magnetization. One of the problems with such devices is that the film structures associated with these devices are relatively complicated. It is therefore believed that an enhanced film structure as disclosed herein can be implemented to simplify the magnetic sensor fabrication while providing an improved and enhanced off-axis rejection.

BRIEF SUMMARY OF THE INVENTION

The following summary of the invention is provided to facilitate an understanding of some of the innovative features unique to the present invention and is not intended to be a full description. a full appreciation of the various aspects of the invention can be gained by taking the entire specification, claims, drawings, and abstract as a whole.

It is, therefore, one aspect of the present invention to provide for an improved magnetoresistive sensing apparatus.

It is another aspect of the present invention to provide for a magnetoresistive sensing apparatus that detects magnetic fields along a particular direction while retaining information concerning the polarity of saturating magnetic fields in a given direction, while being able to readily read-out such data.

It is a further aspect of the present invention to provide for a magnetoresistive sensing apparatus in which the magnetization in thin magnetic films thereof is biased based on an odd transfer function.

It is an additional aspect of the present invention to provide for a magnetoresistive sensing apparatus having a zig-zag shaped structure, which controls the magnetization angle thereof.

The aforementioned aspects of the invention and other objectives and advantages can now be achieved as described herein. a magnetoresistive sensing apparatus is disclosed, comprising a magnetic film having a zig-zag shaped structure, a central axis, and a magnetization associated with the magnetic film, wherein the zig-zag shaped structure biases the magnetization direction alternately at positive and negative angles thereof, thereby permitting the magnetoresistive sensing apparatus to be sensitive to a magnetic field parallel to the axis of the magnetoresistive sensing apparatus and insensitive to magnetic fields perpendicular to the axis. The zig-zag shaped structure creates a positive bias angle of the magnetization direction relative to a current direction of the magnetic film. The magnetoresistive sensing apparatus can generally be implemented in the context of an anisotropic magnetoresistive sensor. The magnetic film comprises a thin magnetic film, such as, for example, NiFe.

In general, the magnetoresistive sensing apparatus described herein can be utilized to sense magnetic fields along a particular direction and to retain the information about the polarity of saturating fields in a given direction while being able to readily and efficiently read out such information. The magnetoresistive sensing apparatus can bias the magnetization in thin films, wherein such films possess an odd transfer function (i.e., resistance versus magnetic field curve). In addition, by utilizing the zig-zag shape or structure to control the magnetization angle, the resulting sensor or device can be scaled to increasingly smaller dimensions.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
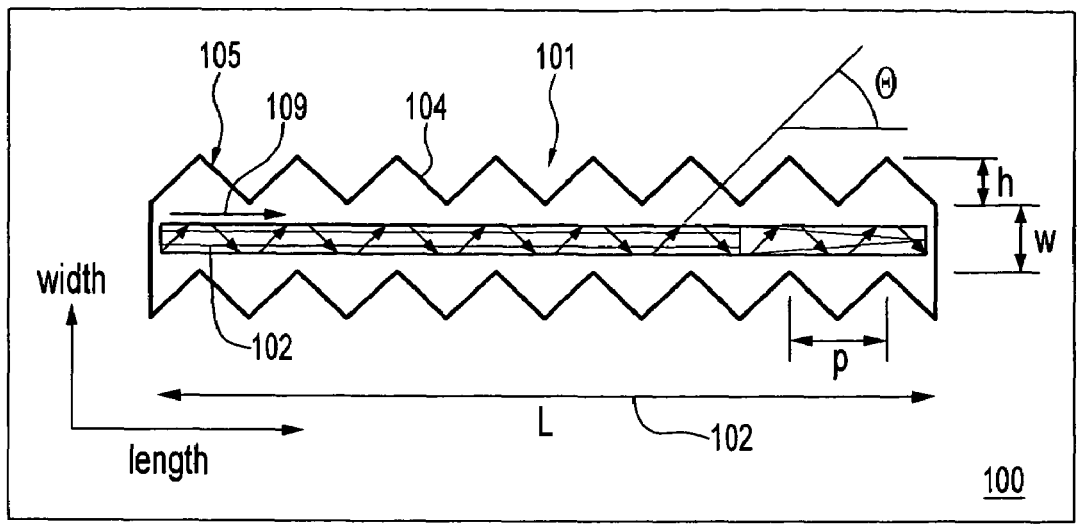
FIG. 1 illustrates a diagram depicting a zig-zag shaped magnetoresistive sensing apparatus, which can be implemented in accordance with a preferred embodiment.

FIG. 1 illustrates a diagram depicting a zig-zag shaped magnetoresistive sensing apparatus 100, which can be implemented in accordance with a preferred embodiment. a range of parameters, which can are generally with the apparatus 100 depicted in FIG. 1, and can be provided as follows:

h>100 nanometers
4h>w>0
2h>p>0.5h
L>3p
t<0.1w

In general, the variable "h" generally represents the height of the triangle utilized to construct the zig-zag structure 101 depicted in FIG. 1. The variable "L" represents the total length of the zig-zag shaped structure depicted in FIG. 1, which forms the magnetoresistive sensing apparatus 100. Likewise, the variable "t" represents the thickness of the film 105 depicted in FIG. 1. Also, the variable "w" represents width of the current path associated with the current 102 in film 105. The variable "p" represents the periodicity of the zig-zag structure 101 depicted in FIG. 1. The magnetization direction is generally indicated by arrow 109 in FIG. 1.

In order for the zig-zag shaped magnetoresistive sensing apparatus 100 to operate as a sensor with an odd transfer function, the magnetization at zero field should be maintained at an angle greater than zero with respect to the current 102, as depicted in FIG. 1. In the configuration illustrated in FIG. 1, parallel jagged edges 104 can be provided, which are similar to a sequence of triangles, thereby forming a "zig-zag" zig-zag due to a dipole effect, as indicated in FIG. 1. Two types of domains are therefore predominant, with a spatial magnetization at angles ±θ with respect to the length 106 (L) of the magnetoresistive sensing apparatus 100. Note that in the configuration depicted in FIG. 1, the magnitude of the angle θ is generally greater than the value zero.

When a magnetic field is applied along the length 106 of the magnetoresistive sensing apparatus 100, the magnetization angle inside the alternating domains increase or decrease in both types of domains, depending upon the sign (i.e., polarity) of the magnetic field (i.e., a scissor mode). Such a scenario can be followed by a corresponding increase or decrease, respectively, in the resistance of each individual domain. Because all elements are in series, the net resistance will increase or decrease.

On the other hand, if the magnetic field is applied perpendicular to the length of the sensor or magnetoresistive sensing apparatus 100, θ a will increase inside one type of domain and will decrease inside the other type (i.e., rotation mode of the magnetization). This results in opposing resistance changes between the domains. Such changes in series therefore tend to cancel, resulting in a reduced overall response of the sensor. Thus, the magnetoresistive sensing apparatus 100 is relatively insensitive to applied magnetic fields along the axis perpendicular to the length 106 (L) of the magnetoresistive sensing apparatus 100.

When used as a data storage element, if the magnetoresistive sensing apparatus 100 is saturated by a magnetic field applied along its length, after the magnetic field is removed, the slope of the transfer curve at or near a zero magnetic field possesses the same sign or polarity as the applied magnetic field. The state of the magnetization (i.e., right or left) can be then determined by measuring the slope of the resistance as a function of the magnetic field at a zero magnetic field value. This action constitutes retention of past information and can be referred to as the "memory effect". The amount of magnetic field necessary to erase the previously stored information and record new information can be referred to as a "coercive field".

Figure 2:
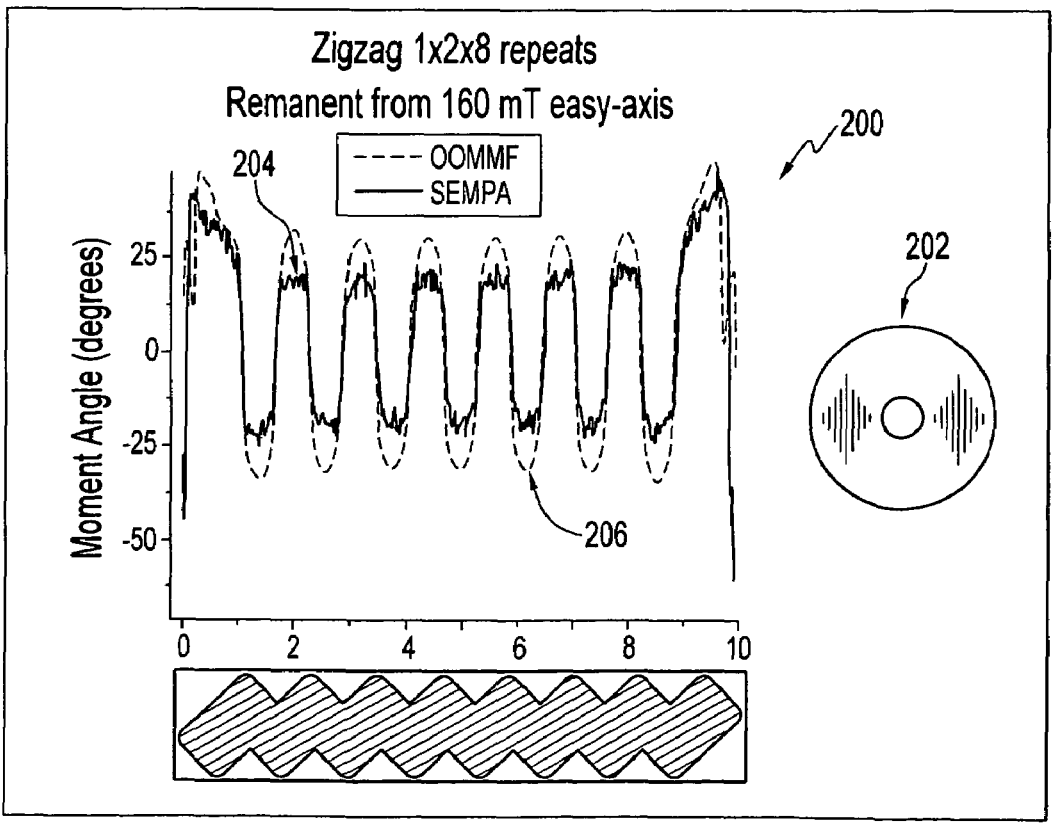
FIG. 2 illustrates a scanning electron micrograph with polarization analysis, in accordance with one embodiment.

FIG. 2 illustrates a scanning electron micrograph 200 with polarization analysis, in accordance with one embodiment. In the example illustrated in FIG. 2, micrograph 200 has been generated with a polarization analysis based on a 3 μm×16 μm, 30 nm thick NiFe film, which can be utilized to implement film 105 depicted in FIG. 1. The magnetization direction is generally indicated by the circular map 202 depicted to the right of micrograph 200 as depicted in FIG. 2. Micrograph 200 therefore generally represents a scanning electron micrograph with polarization of the zig-zag shaped magnetic thin film 105 depicted in FIG. 1.

Additionally, a curve 204 illustrated in FIG. 2 generally represents the actual magnetization angle that occurs toward the center of, for example, element or film 105 depicted in FIG. 1. a solid blue curve 206 depicted in micrograph 200 can be generated as a simulation based on a modeling program, such as, for example, the Object Oriented Micromagnetic Framework (OOMMF) modeling program.

Note that OOMMF refers generally to a project in the Mathematical and Computational Sciences Division (MCSD) of the Information Technology Laboratory (ITL) and the National Institute of Standards and Technology (NIST) in cooperation with the Micromagnetic Modeling Activity Group (pMAG), aimed at developing portable, extensible public domain programs and tools for micromagnetics. The end product resulting from such an effort is a fully functional micromagnetic code, with a well documented, flexible programmers interface that allows developers outside the OOMMF project to swap their own code in and out as desired. The heart of the code can be written in, for example, C++ with a tool command language interface based on, for example, Tcl/Tk, and possibly OpenGL. Target systems generally include a wide range of Unix platforms and Windows (9x and later). The open source scripting language Tcl/Tk may be required to run OOMMF.

Figure 3B:
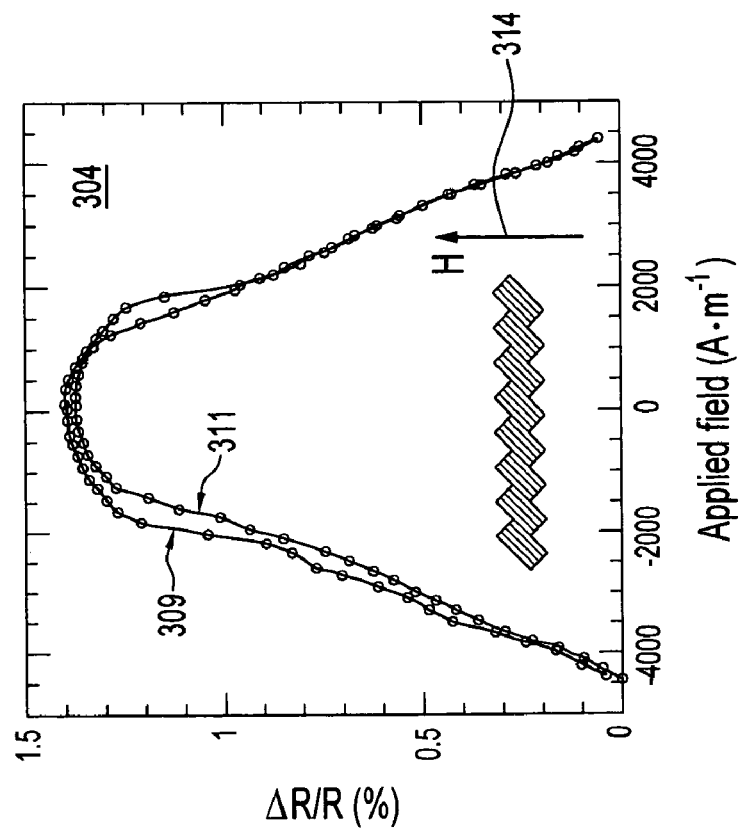
FIG. 3 illustrates graphs depicting resistance change versus the magnetic field along or perpendicular to the axis of the sensor or magnetoresistive sensing apparatus depicted in FIG. 1, in accordance with another embodiment.
Figure 3A:
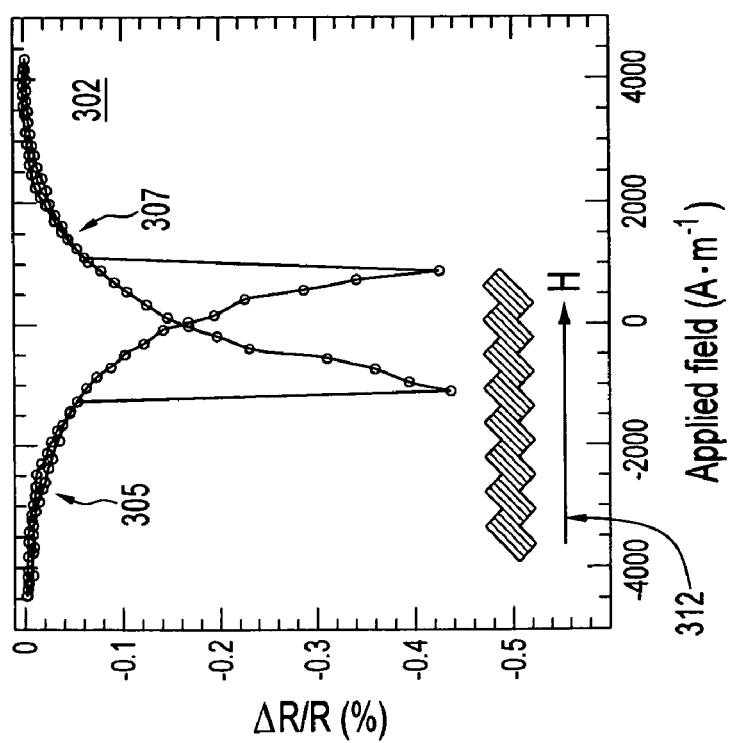

FIG. 3 illustrates graphs 302 and 304 depicting resistance change versus the magnetic field along or perpendicular to the axis of the sensor or magnetoresistive sensing apparatus 100 depicted in FIG. 1, in accordance with another embodiment. Graphs 302 and 304 therefore illustrate data, which can be utilized to generate transfer curves 305, 307 and 309, 311 associated with a NiFe zig-zag element or component depicted in FIG. 1. FIG. 3 generally illustrates transfer curves of a device that can be constructed with the same dimensions as the apparatus associated with the data depicted in micrograph 200 of FIG. 2. The only difference between the two devices is that in FIG. 3, contacts can be made to the ends of such a device utilizing aluminum pads.

The measurements obtained are generally generated by a standard four-probe geometry for current and voltage. The curves 305, 307 and 309, 311 depicted in FIG. 3 indicate that in the range of a low magnetic field, |H|<1000 A/m, the elements are sensitive to fields along the long axis 312 depicted in graph 302 and insensitive to fields perpendicular as indicated by axis 314 illustrated in graph 304. Graph 304 also illustrates the two remnant resistances described by their respective slopes at a zero magnetic field. FIG. 3 therefore illustrates transfer curves associated with a 3 μm×16 μm, 30 nm thick NiFe zig-zag element.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A magnetoresistive sensing apparatus, comprising:
a magnetic film having a zig-zag shaped structure, a central axis, and a magnetization associated with said magnetic film, wherein said zig-zag shaped structure biases said magnetization direction alternately at positive and negative angles thereof, thereby permitting said magnetoresistive sensing apparatus to be sensitive to a magnetic field parallel to said axis of said magnetoresistive sensing apparatus and insensitive to magnetic fields perpendicular to said axis.

2. The apparatus of claim 1 wherein said zig-zag shaped structure creates a positive bias angle of said magnetization direction relative to a current direction of with said magnetic film.

3. The apparatus of claim 1 wherein said magnetoresistive sensing apparatus comprises an anisotropic magnetoresistive sensor.

4. The apparatus of claim 1 wherein said magnetic film comprises a thin magnetic film.

5. The apparatus of claim 4 wherein said thin magnetic film comprises NiFe.

6. The apparatus of claim 4 wherein said thin magnetic film comprises a thickness of approximately 30 nm.

7. The apparatus of claim 1, wherein said magnetoresistive sensing apparatus detects magnetic fields along a particular direction, while retaining data indicative of the polarity of saturating fields in said particular direction.

8. The apparatus of claim 1 wherein said magnetoresistive sensing apparatus retains data indicative of an amplitude of said magnetic field applied to said axis of said magnetic film.

9. The apparatus of claim 1 wherein said zig-zag shaped structure of said magnetic film utilizes its geometry to bias said magnetization direction on a single layer element composing said magnetic film.

10. The apparatus of claim 1 wherein said magnetic film is adapted for use as a data storage element.

11. A magnetoresistive sensing apparatus, comprising:
anisotropic magnetoresistive sensor comprising a thin magnetic film having a zig-zag shaped structure, wherein said thin magnetic film is adapted for use as a data storage element;
a central axis associated with said zig-zag shaped structure; and
a magnetization associated with said thin magnetic film, wherein said zig-zag shaped structure biases said magnetization direction alternately at positive and negative angles thereof, thereby permitting said magnetoresistive sensing apparatus to be sensitive to a magnetic field parallel to said axis of said magnetoresistive sensing apparatus and insensitive to magnetic fields perpendicular to said axis, and wherein said zig-zag shaped structure creates a positive bias angle of said magnetization direction relative to a current direction of with said thin magnetic film.

12. The apparatus of claim 11, wherein said magnetoresistive sensing apparatus detects magnetic fields along a particular direction, while retaining data indicative of the polarity of saturating fields in said particular direction.

13. The apparatus of claim 11, wherein said magnetoresistive sensing apparatus retains data indicative of an amplitude of said magnetic field applied to said axis of said thin magnetic film.

14. The apparatus of claim 11, wherein said zig-zag shaped structure of said magnetic film utilizes its geometry to bias said magnetization direction on a single layer element composing said thin magnetic film.

15. The apparatus of claim 11 wherein said thin magnetic film comprises a thickness of approximately 30 nm.

16. A magnetoresistive sensing method, comprising:
configuring an anisotropic magnetoresistive sensor to comprise a thin magnetic film having a zig-zag shaped structure, such that said thin magnetic film is adaptable for use as a data storage element;
providing said aid zig-zag shaped structure with a central axis; and
configuring said thin magnetic film with a magnetization, wherein said zig-zag shaped structure biases said magnetization direction alternately at positive and negative angles thereof, thereby permitting said magnetoresistive sensing apparatus to be sensitive to a magnetic field parallel to said axis of said magnetoresistive sensing apparatus and insensitive to magnetic fields perpendicular to said axis, and wherein said zig-zag shaped structure creates a positive bias angle of said magnetization direction relative to a current direction of with said thin magnetic film.

17. The method of claim 11, wherein said magnetoresistive sensing apparatus detects magnetic fields along a particular direction, while retaining data indicative of the polarity of saturating fields in said particular direction.

18. The method of claim 15, wherein said magnetoresistive sensing apparatus retains data indicative of an amplitude of said magnetic field applied to said axis of said thin magnetic film.

19. The method of claim 15, wherein said zig-zag shaped structure of said magnetic film utilizes its geometry to bias said magnetization direction on a single layer element composing said thin magnetic film.

20. The method of claim 15 further comprising configuring said thin magnetic film with a thickness of approximately 30 nm.

* * * * *